(12) United States Patent
Kang et al.

(10) Patent No.: US 7,015,691 B2
(45) Date of Patent: Mar. 21, 2006

(54) WEAK-MAGNETIC FIELD SENSOR USING PRINTED CIRCUIT BOARD TECHNOLOGY AND METHOD OF MANUFACTURING THE SAME

(75) Inventors: Myung-Sam Kang, Daejeon (KR); Sang-On Choi, Suwon-si (KR); Won-Youl Choi, Suwon-si (KR); Jang-Kyu Kang, Daejeon-si (KR)

(73) Assignee: Samsung Electro-Mechanics Co., LTD, Kyunggi-Do (KR)

( * ) Notice: Subject to any disclaimer, the term of this patent is extended or adjusted under 35 U.S.C. 154(b) by 0 days.

(21) Appl. No.: 10/639,285

(22) Filed: Aug. 12, 2003

(65) Prior Publication Data

US 2004/0124836 A1 Jul. 1, 2004

(30) Foreign Application Priority Data

Dec. 31, 2002 (KR) ...................... 10-2002-0087883

(51) Int. Cl.
*G01R 33/04* (2006.01)
(52) U.S. Cl. ...................................... 324/253; 324/249
(58) Field of Classification Search ................ 324/249, 324/244, 253, 258, 260; 438/3, 48; 336/200
See application file for complete search history.

(56) References Cited

U.S. PATENT DOCUMENTS

| | | | |
|---|---|---|---|
| 4,272,724 A * | 6/1981 | Wada et al. ................. 324/253 |
| 4,646,015 A | 2/1987 | Phillips |
| 4,995,165 A * | 2/1991 | Daniels ........................ 33/361 |
| 5,199,178 A * | 4/1993 | Tong et al. .................... 33/361 |
| 5,672,967 A * | 9/1997 | Jensen et al. ................ 324/253 |
| 5,936,403 A | 8/1999 | Tamura |
| 6,270,686 B1 | 8/2001 | Tamura |
| 6,270,889 B1 * | 8/2001 | Kataoka et al. ............. 428/352 |
| 6,278,272 B1 * | 8/2001 | Scarzello et al. ........... 324/253 |
| 6,407,547 B1 * | 6/2002 | Yamada et al. ............. 324/253 |
| 6,411,086 B1 * | 6/2002 | Choi et al. .................. 324/253 |
| 6,414,564 B1 * | 7/2002 | Mizoguchi et al. ........... 333/35 |
| 6,690,164 B1 * | 2/2004 | Fedeli et al. ................ 324/253 |
| 6,747,450 B1 * | 6/2004 | Kang et al. ................. 324/253 |
| 2001/0030537 A1 * | 10/2001 | Honkura et al. ............ 324/249 |
| 2002/0013005 A1 * | 1/2002 | Rhee ............................. 438/3 |

* cited by examiner

*Primary Examiner*—Bot Ledynh
*Assistant Examiner*—Kenneth J Whittington
(74) *Attorney, Agent, or Firm*—Gottlieb, Rackman & Reisman, P.C.

(57) ABSTRACT

In a weak-magnetic field sensor a rectangular ring-shaped magnetic core is wound by exciting circuit patterns and detecting circuit patterns, and weak-magnetic field sensors are implemented in x-axis and y-axis directions, respectively, to precisely calculate azimuth, thereby sensing a weak-magnetic field having a strength similar to that of earth's magnetic field. The sensor includes a magnetic core having first and second cores connected in parallel to each other; exciting coils wound around the first and second cores, respectively, to supply alternating excitation current to the magnetic core; and a detecting coil alternately arranged together with the exciting coils on the same surfaces on which the exciting coils are formed, and wound around the first and second cores, in order to detect variation of magnetic fluxes generated in the magnetic core.

7 Claims, 19 Drawing Sheets

WEAK-MAGNETIC FIELD SENSOR USING PRINTED CIRCUIT BOARD TECHNOLOGY AND METHOD OF MANUFACTURING THE SAME

BACKGROUND OF THE INVENTION

1. Field of the Invention

The present invention relates generally to a weak-magnetic field sensor using printed circuit board technology and method of manufacturing the same, and more particularly to a weak-magnetic field sensor using printed circuit board technology and method of manufacturing the same, in which a rectangular ring-shaped magnetic core is wound by exciting circuit patterns and detecting circuit patterns, and weak-magnetic field sensors are implemented in x-axis and y-axis directions, respectively, to precisely calculate azimuth, thereby sensing a weak-magnetic field having a strength similar to that of earth's magnetic field.

2. Description of the Prior Art

Recently, as various kinds of information services are expanded according to the spread of mobile phones and mobile terminals, location information services have become basic functions, but more detailed and convenient services are required in the future. Additionally, a sensor capable of sensing a current location is needed to obtain desired location information.

For a means for providing the location information, a weak-magnetic field sensor for sensing the earth's magnetic field and detecting a location, that is, a magnetic sensor for sensing the earth's weak magnetic field using magnetic materials and coils, has been used for highly sensitive magnetic sensors.

The conventional weak-field magnetic sensor is formed by winding a conductive coil by hand around a relatively large bar core or ring core formed of a magnetic ribbon. Additionally, an electronic circuit is needed to obtain a magnetic field proportional to a measurement magnetic field. For example, a flux-gate magnetic sensor is used as general parts of the conventional weak-magnetic field sensor. The flux-gate magnetic sensor uses a core formed of a high permeability magnetic material, and recognizes a direction using voltage difference generated from a primary coil winding the magnetic core, thus sensing a weak magnetic field.

The conventional flux-gate magnetic sensor is formed by winding a copper wire made of copper around a circular-shaped magnetic core in a regular direction. In detail, in the flux-gate magnetic sensor, a driving coil (primary coil) is formed by winding a copper wire made of copper around the magnetic core in a regular direction with regular intervals and stress to generate a magnetic field in the magnetic core. Thereafter, a pick-up coil (secondary coil) is formed to sense the magnetic field generated in the magnetic core by the driving coil, and in this case, the pick-up coil is also formed by winding a copper wire around the magnetic core with regular intervals and stress.

As described above, the flux-gate magnetic sensor formed by winding the copper wires includes the driving coil and the pick-up coil for detecting the magnetic field generated in the magnetic core by the driving coil. The driving and pick-up coils are wound around the magnetic core using wire coil technology previously widely known. In this case, the secondary coil should be wound to be perpendicular to x-axis and y-axis directions because it should precisely analyze the sensitivity of the magnetic field.

In the conventional flux-gate magnetic sensor, the coils should be accurately wound around the core. It is difficult to maintain such location accuracy due to the wires having a diameter of several tens of micrometers. Accordingly, since the wires are influenced by temperature, light and surface material, the location accuracy of the coils is deteriorated.

Additionally, the flux-gate magnetic sensor is problematic in that the coils are directly wound around the magnetic core, so that the coils are frequently cut. Further, the size of the sensor is increased, so the sensor does not correspond to a trend toward miniaturization and slimness of electronic devices and, therefore, its power consumption is increased.

To solve the problems of the conventional flux-gate magnetic sensor, a weak-magnetic field sensor is disclosed in U.S. Pat. Nos. 5,936,403 and 6,270,686. In these Patents, an amorphous core is formed by stacking two amorphous boards, each having a circular conductor pattern, on opposite sides of an epoxy base board, which has a particular pattern etched thereon and the capacity for vertical conductivity, and epoxy bases, which have a coil X and a coil Y, respectively, are stacked on the top and bottom surfaces of the amorphous core.

However, in the U.S. Pat. No. 5,936,403, since the amorphous core is formed by stacking the two amorphous boards each having the circular pattern, on opposite sides of the epoxy base board to correspond to the circular patterns, the manufacturing process of the weak-magnetic field sensor is complicated and the manufacturing cost thereof is increased due to many layers of the sensor.

SUMMARY OF THE INVENTION

Accordingly, the present invention has been made keeping in mind the above problems occurring in the prior art, and an object of the present invention is to provide a weak-magnetic field sensor using printed circuit board technology and method of manufacturing the same, in which a magnetic core influenced by the earth's magnetic field is formed as a rectangular ring-shaped closed magnetic circuit, thereby minimizing the leakage of magnetic flux generated in the excited magnetic core.

Another object of the present invention is to provide a weak-magnetic field sensor using printed circuit board technology and method of manufacturing the same, in which exciting coils are separated such that they are wound around two portions of a magnetic core, respectively, and driving signals generated in the magnetic core are therefore cancelled, thereby easily processing the signals generated in the core.

Another object of the present invention is to provide a weak-magnetic field sensor using printed circuit board technology, which has high sensitivity and is advantageous in terms of mass producibility and low manufacturing costs.

Another object of the present invention is to provide a weak-magnetic field sensor using printed circuit board technology, which can precisely detect a magnetic field and be miniaturized.

In order to accomplish the above object, the present invention provides a weak-magnetic field sensor using printed circuit board technology, including a first magnetic core having first and second cores connected in parallel to each other; first exciting coils wound around the first and second cores, respectively, to supply alternating excitation current to the first magnetic core; and a first detecting coil alternately arranged together with the first exciting coils on the same surfaces on which the first exciting coils are formed, and wound around the first and second cores, in order to detect variation of magnetic fluxes generated in the first magnetic core; wherein the first exciting coils formed of metallic materials to be solenoidal for alternating current excitation and differential excitation and the first detecting coil formed of a metallic material to be solenoidal for detecting the variation of the magnetic fluxes generated in the first magnetic core are formed on the same surfaces; wherein the first magnetic core is formed in a direction in which the magnetic fluxes are detected to reduce demagnetizing field components.

The first magnetic core is a rectangular ring-shaped core.

The exciting coils separated from each other and the detecting coil are solenoid coils formed on the same surfaces, and surround the first magnetic core.

Upper and lower portions of each of the exciting coils and the detecting coil are connected by blind via holes coated with copper.

Lands of each of the exciting coils and lands of the detecting coil are arranged to form two lines.

The exciting coils are wound from lower portions of the first and second cores, respectively, and they are symmetrical to each other.

The weak-magnetic field sensor further includes a second magnetic core having third and fourth cores connected in parallel to each other and formed in a surface perpendicular to a surface on which the first magnetic core is formed; second exciting coils wound around the third and fourth cores, respectively, to supply alternating excitation current to the second magnetic core; and a second detecting coil alternately arranged together with the second exciting coils on the same surfaces on which the second exciting coils are formed, and wound around the third and fourth cores, in order to detect variation of magnetic fluxes generated in the second magnetic core.

The magnetic core, the exciting coil and the detecting coil are formed on a printed circuit board, and the printed circuit board includes a Copper Clad Laminate (CCL) and a prepreg, and the prepreg is formed of one of FR-4 epoxy, BT resin, Teflon and polyimide.

In order to accomplish the above object, the present invention provides a weak-magnetic field sensor using printed circuit board technology, including a copper clad laminate; exciting coils formed using exciting circuit patterns by etching copper foils arranged on both sides of the copper clad laminate, respectively; a detecting coil formed using detecting circuit patterns to be alternately arranged with the exciting coils on the same surfaces on which the exciting coils are formed; an x-axis magnetic core formed between layers each having the exciting and detecting circuit patterns forming the exciting and detecting coils, respectively; and a binder for attaching the layers to the x-axis magnetic core; wherein the x-axis magnetic core is formed in a direction in which magnetic fluxes are detected to reduce demagnetizing field components.

The weak-magnetic field sensor further includes a y-axis magnetic core formed in a surface perpendicular to a surface on which the x-axis magnetic core is formed.

In order to accomplish the above object, the present invention provides a method of manufacturing a weak-magnetic field sensor using printed circuit board technology, includes the steps of: forming a first inner layer provided with exciting and detecting circuit patterns formed at each of two positions below an upper magnetic core and above a lower magnetic core, on a copper clad laminate using copper foils formed on both sides of the copper clad laminate; forming a second inner layer by disposing magnetic ribbons for forming the upper and lower magnetic cores above an upper prepreg and below a lower prepreg, respectively, and attaching the magnetic ribbons along with the prepregs on both sides of the first inner layer, respectively, so that the magnetic ribbons are in contact with the first inner layer; forming an outer layer by forming upper and lower prepregs on both sides of the second inner layer, respectively, and forming a copper foil at each of two positions above the upper prepreg and below the lower prepreg; removing some portions of the copper foils using a laser drill in order to form blind via holes for connecting exciting circuit patterns formed above and below each of the upper and lower magnetic cores to be solenodal and connecting detecting circuit patterns formed above and below each of the upper and lower magnetic cores to be solenodal; etching the portions where the copper foils are removed using a laser drill for removing only epoxy so that the circuit patterns of the first inner layer are exposed, and metal coating surfaces exposed to the outside and blind via holes; and forming exciting and detecting circuit patterns at each of two positions above the upper magnetic core and below the lower magnetic core, by exposure and etching processes.

The step of forming the second inner layer is performed by the steps of: disposing the upper and lower prepregs above and below the first inner layer, respectively; precisely disposing the magnetic ribbons for forming the upper and lower magnetic cores above the upper prepreg and below the lower prepreg, respectively; laying up the copper foils manufactured larger than the magnetic ribbons to find precise locations of the copper foils; attaching the magnetic ribbons along with the prepregs on both sides of the first inner layer, respectively, under high temperature and high pressure so that the magnetic ribbons are in contact with the first inner layer; and forming the upper and lower magnetic cores by forming, exposing, developing and etching photosensitive coating layers.

Accordingly, the weak-magnetic field sensor using printed circuit board technology according to the present invention includes a magnetic core formed in a substrate, exciting coils (exciting circuit) formed of metallic materials for alternating current excitation and a detecting coil (detecting circuit) formed of a metallic material to detect the variation of magnetic fluxes induced by the exciting coil. The magnetic core is formed in a direction in which the magnetic fluxes are detected to reduce demagnetizing field components. Additionally, the weak-magnetic field sensor of the present invention includes separated differential exciting coils (exciting circuit) wound around two parallel cores of the rectangular ring-shaped magnetic core, respectively, and the detecting coil formed in the same surface on which the exciting coils are formed to obtain the sum of magnetic fluxes generated in the magnetic core. Accordingly, if an external magnetic field is zero, no waveform is induced in the detecting coil.

Additionally, the weak-magnetic field sensor includes one component including a rectangular ring-shaped magnetic core formed in the same surface to minimize magnetic field components leaking from the magnetic core, exciting coils formed to be separated from one another so that detecting circuit patterns disposed above and below the magnetic core, respectively, correspond to each other, and a detecting coil formed between the exciting coils is formed above or below another component having the same construction as that of the one component to be rotated by 90°, so that the sensor can have high sensitivity.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
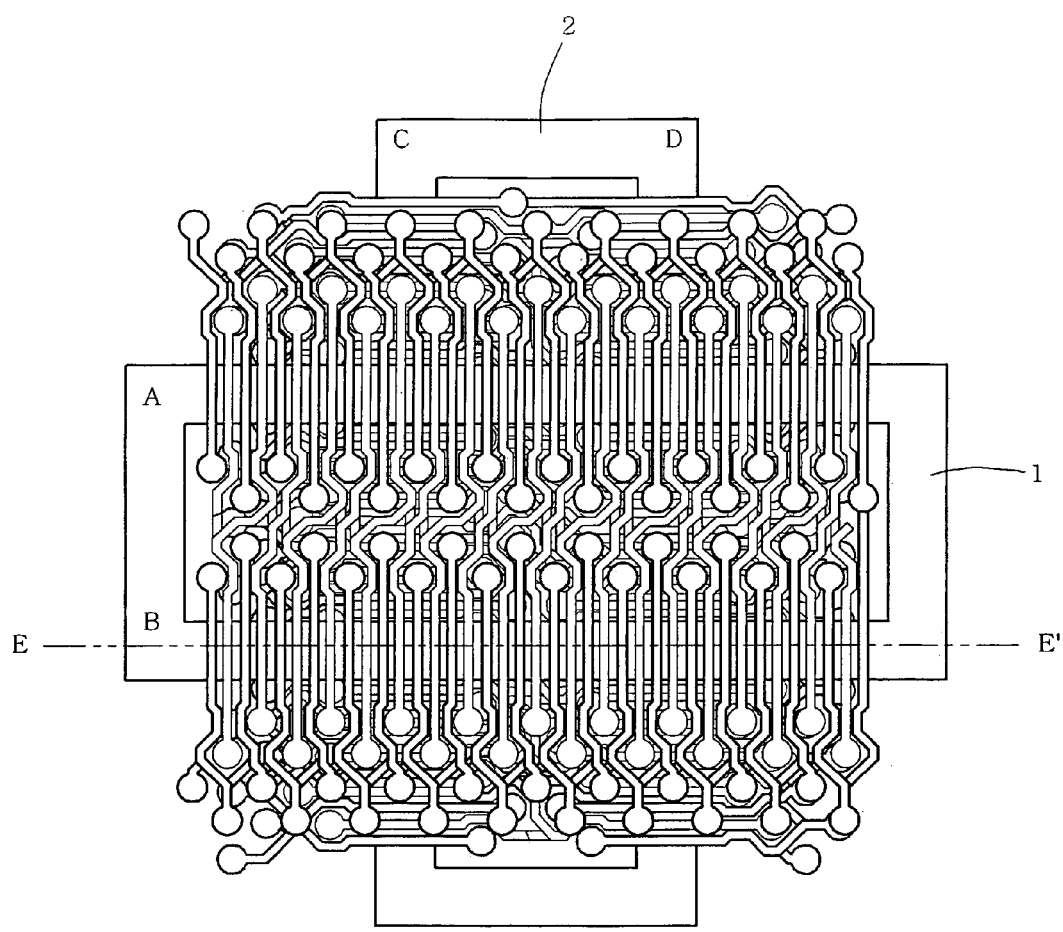
FIG. 1 is schematic view of a weak-magnetic field sensor having sensors formed in x-axis and y-axis directions, respectively, with the exception of the outermost layer in accordance with the present invention.

Reference now should be made to the drawings, in which the same reference numerals are used throughout the different drawings to designate the same or similar components.

Hereinafter, a weak-magnetic field sensor using printed circuit board technology and method of manufacturing the same according to the embodiments of the present invention is described in detail with reference to the accompanying drawings.

FIG. 1 is schematic view of a weak-magnetic field sensor having sensors formed in x-axis and y-axis directions, respectively, with the exception of the outermost layer in accordance with the present invention, which schematically shows the construction of the weak-magnetic field sensor that simultaneously senses a magnetic field in the x-axis and y-axis directions using separate exciting coils.

Figure 2:
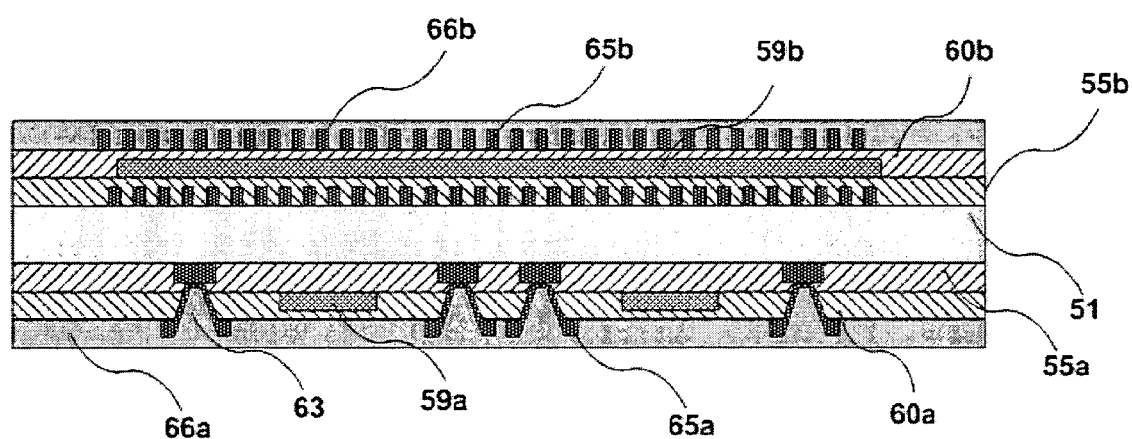
FIG. 2 is a sectional view taken along lines E–E' of FIG. 1 in accordance with the present invention.

FIG. 2 is a sectional view taken along lines E–E' of FIG. 1 in accordance with the present invention, which shows the sectional construction of the weak-magnetic field sensors. In this case, the separated exciting coils mean that they are wound around the parallel two portions of each of two magnetic cores, respectively.

Referring to FIGS. 1 and 2, the weak-magnetic field sensor using printed circuit board technology according to the embodiment of the present invention includes an x-axis magnetic core 1, a y-axis magnetic core 2 perpendicular to the x-axis magnetic core 1 and coils that wind the x-axis and y-axis magnetic cores 1 and 2. That is, the weak-magnetic field sensors according to the embodiment of the present invention include the x-axis and y-axis magnetic cores 1 and 2 arranged above and below a copper clad laminate 51 of a printed circuit board, respectively. In this case, reference numerals 55a and 55b designate firstly stacked prepregs, respectively, and reference numerals 60a and 60b designate secondly stacked prepregs, respectively. The coils are divided into exciting coils and detecting coils, which will be described in detail in conjunction with FIGS. 4a to 5c.

Figure 3A:
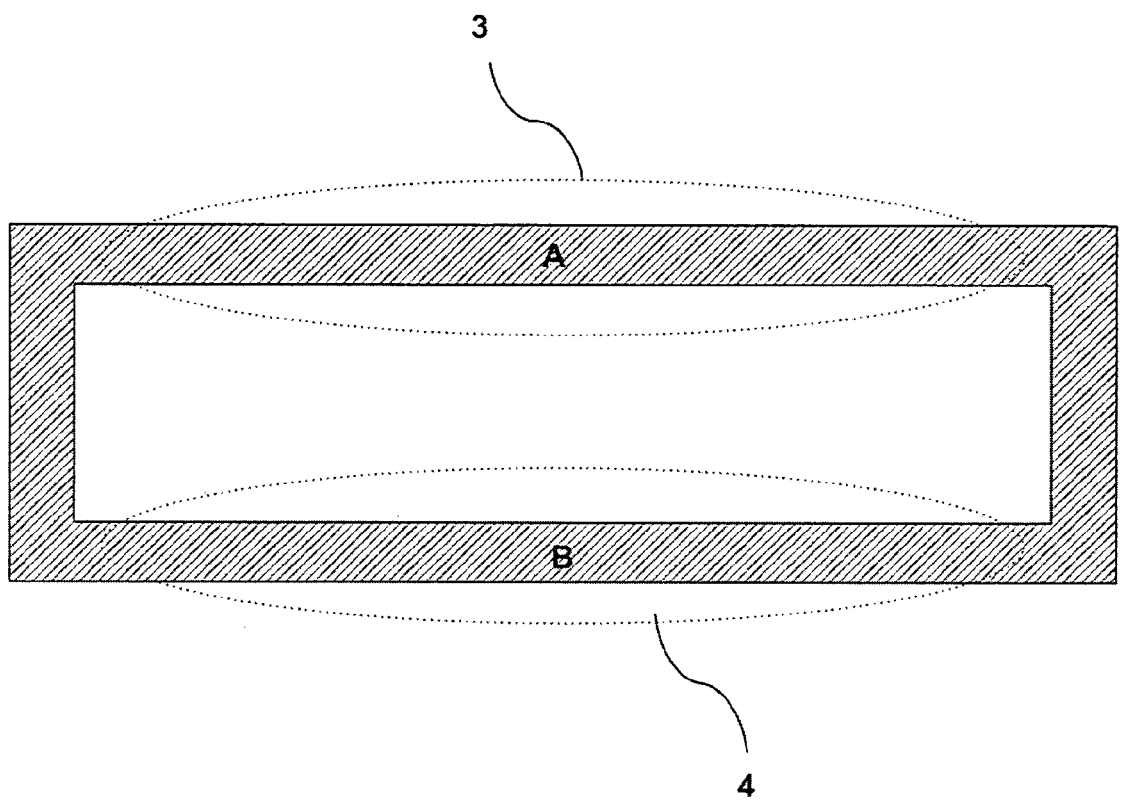
FIGS. 3a and 3b are schematic views of x-axis and y-axis magnetic cores of the weak-magnetic field sensor using printed circuit board technology in accordance with the present invention.
Figure 3B:
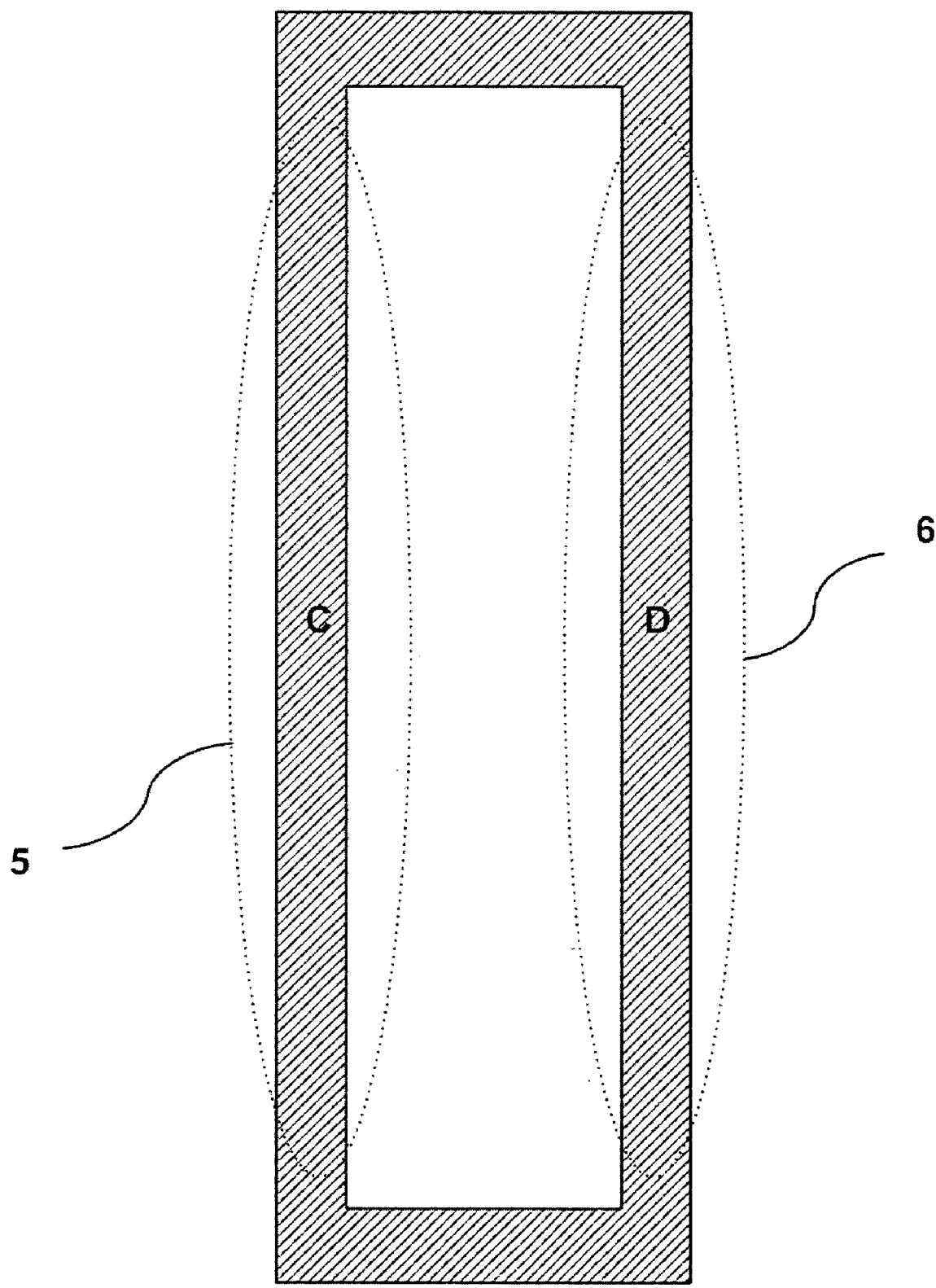

FIGS. 3a and 3b are schematic views of x-axis and y-axis magnetic cores of the weak-magnetic field sensor using printed circuit board technology in accordance with the present invention. In FIG. 3a, reference numerals 3 and 4 designate an x-axis upper magnetic core (hereinafter referred to as an "A core") and an x-axis lower magnetic core (hereinafter referred to as a "B core"), respectively. Additionally, in FIG. 3b, reference numerals 5 and 6 designate a y-axis upper magnetic core (hereinafter referred to as a "C core") and a y-axis lower magnetic core (hereinafter referred to as a "D core"), respectively. As shown in FIGS. 3a and 3b, although the x-axis and y-axis magnetic cores 1 and 2 are each formed to have a rectangular ring shape, the shapes of the magnetic cores are not limited to the rectangular ring shapes, but may be formed in any shapes if detecting coils and exciting coils are wound around the parallel two portions of each of the magnetic cores 1 and 2 connected to each other.

Figure 4A:
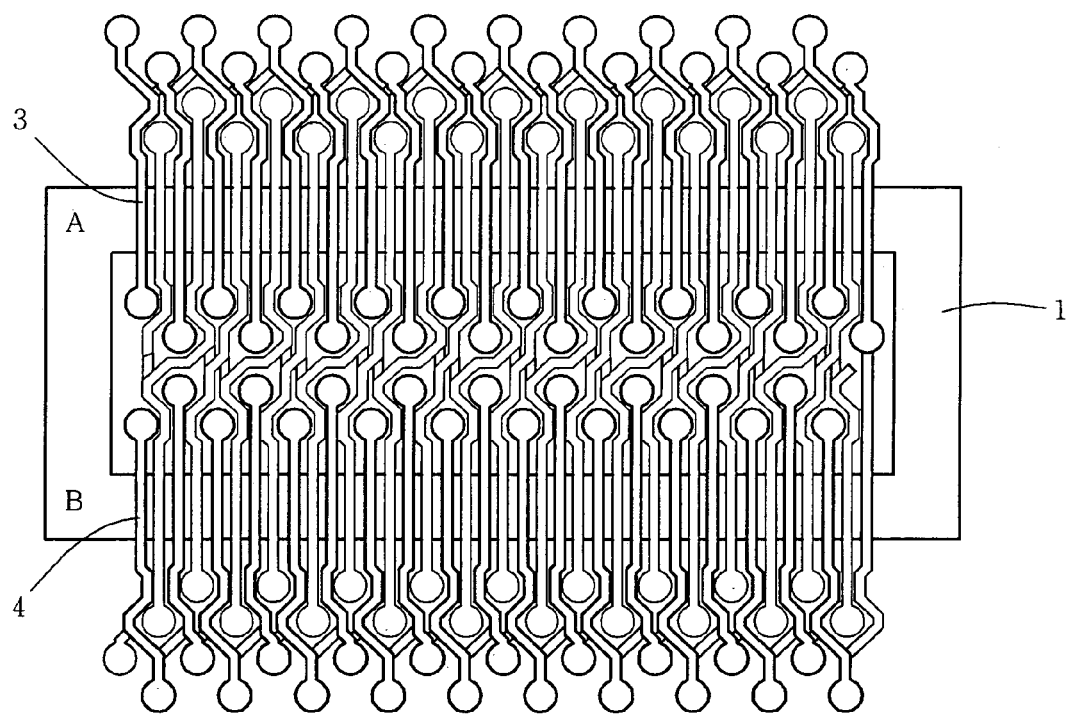
FIGS. 4a to 4c are schematic views of exciting circuit patterns and detecting circuit patterns formed in the x-axis magnetic core of the weak-magnetic field sensor using the printed circuit board technology in accordance with the present invention, which show schematic views of the upper and lower circuit patterns, the upper circuit patterns and the lower circuit pattern of the x-axis magnetic core, respectively.
Figure 4B:
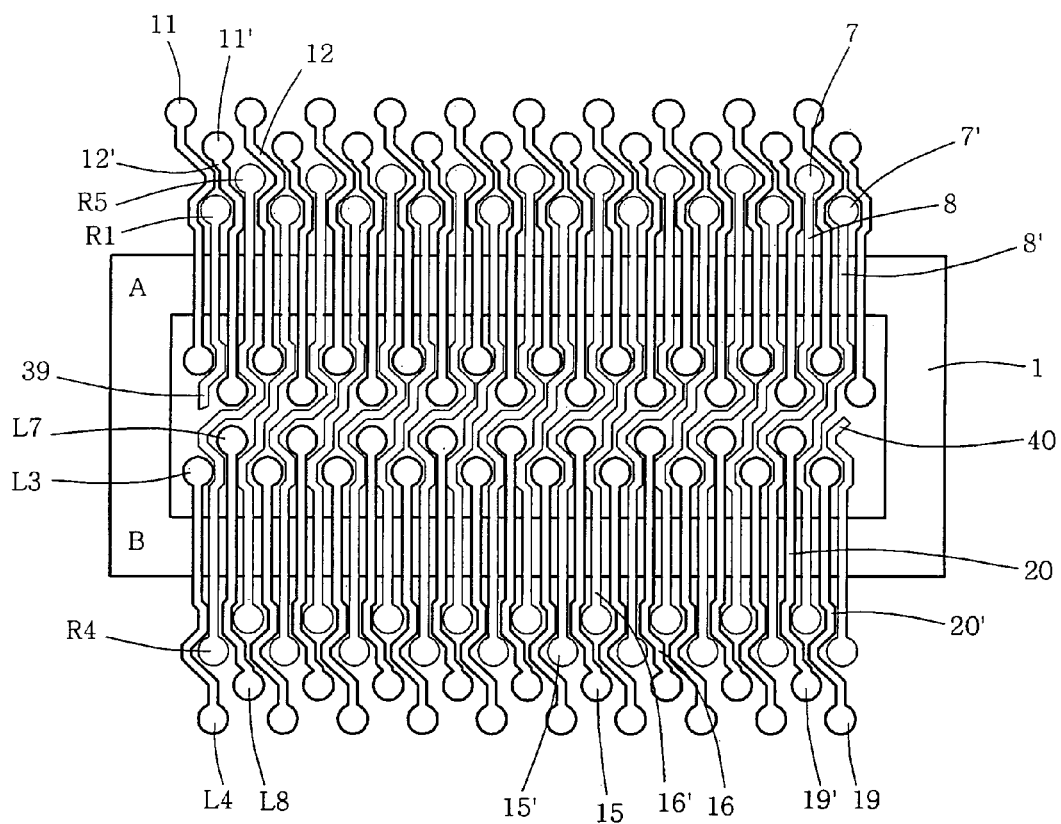
Figure 4C:
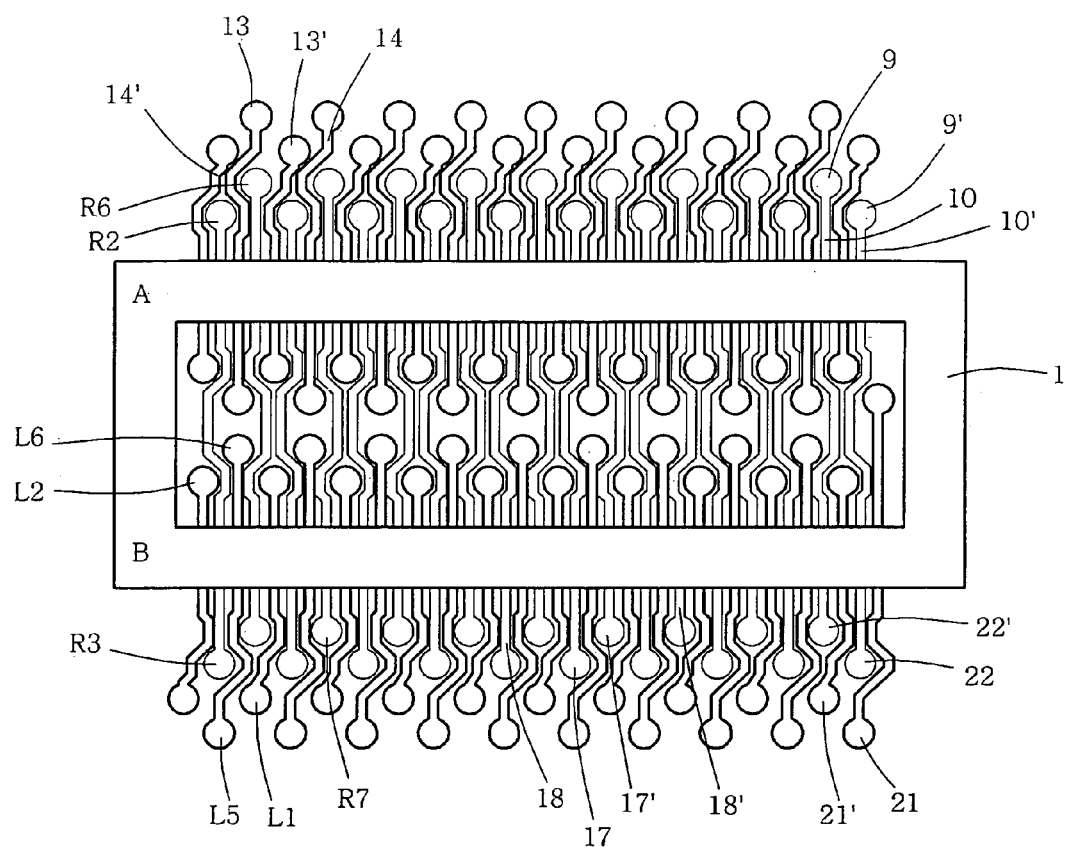

FIGS. 4a to 4c are schematic views of exciting circuit patterns and detecting circuit patterns formed in the x-axis magnetic core of the weak-magnetic field sensor using the printed circuit board technology in accordance with the present invention. FIG. 4a shows a schematic view of the upper and lower circuit patterns of the x-axis magnetic core. FIG. 4b shows a schematic view of the upper circuit patterns of the x-axis magnetic core. FIG. 4c shows a schematic view of the lower circuit pattern of the x-axis magnetic core.

The magnetic cores of the present invention include the x-axis magnetic core 1 and the y-axis magnetic core 2. The x-axis magnetic core 1 includes the A core 3 and the B core 4. The y-axis magnetic core 1 perpendicular to the x-axis magnetic core 1 includes the C core 5 and the D core 6.

In detail, upper detecting circuit lands 7 and 7', upper detecting circuit patterns 8 and 8', lower detecting circuit lands 9 and 9', lower detecting circuit patterns 10 and 10', upper exciting circuit lands 11 and 11', upper exciting circuit patterns 12 and 12', lower exciting circuit lands 13 and 13' and lower exciting circuit patterns 14 and 14' are formed around the A core 3. Corresponding detecting and exciting circuit patterns and lands are formed around the B, C and D cores 4, 5 and 6 in a similar manner. Reference numerals 15 to 22 relates to the B core 4, reference numerals 23 to 30 relates to the C core 5, and reference numerals 31 to 38 relates to the D core 6.

As shown in FIGS. 4a and 4b, the exciting circuit patterns, which are formed above and below the x-axis magnetic core 1, are connected to each other by blind via holes so that two exciting coils are wound around the two A and B cores 3 and 4, respectively.

In this case, if alternating excitation current is applied to the x-axis magnetic core 1, two magnetic fluxes are reversely generated in the two A and B cores 3 and 4 arranged in parallel on the same surface.

Additionally, the detecting circuit patterns, which are formed above and below the x-axis magnetic core 1, are connected to each other by blind via holes, so that detecting coils for detecting the variation of magnetic fluxes is formed to be wound around the two A and B cores 3 and 4 using blind via holes, as shown in FIG. 4b, in order to obtain the sum of the magnetic fluxes generated in the two A and B cores 3 and 4.

The first and second induced voltages in the detecting coil for detecting the variation of magnetic fluxes caused by electromagnetic induction resulting from the application of the alternating excitation current cancel each other, since the magnetic fluxes generated in the two A and B cores 3 and 4 have reverse directions. However, since an external magnetic field Hext is applied to the A and B cores 3 and 4 in the same direction when the external magnetic field Hext is applied in the axis direction of the two A and B cores 3 and 4, the magnetic fields in the two A and cores 3 and 4 are Hext+Hexc and Hext−Hexc, respectively, when an exciting magnetic field is referred to as the Hexc. The magnetic fields, magnetic densities and induced voltages in the A and B cores 3 and 4 will be later described with reference to FIGS. 7a to 7f.

Referring to FIGS. 4a to 4c, in the weak-magnetic field sensor using the printed circuit board technology according to the present invention, separated exciting coils are wound around the A and B cores 3 and 4 to be solenoidal, respectively, and a detecting coil for detecting the variation of magnetic fluxes is arranged between the exciting coils to be solenoidal in order to obtain the sum of the variation of the magnetic fluxes generated in the two A and B cores 3 and 4. Although one detecting coil for detecting the variation of magnetic fluxes is formed with respect to the two exciting coils in the embodiment of the present invention, the number of detecting coils is not limited to one.

As described above, using the exciting coils and the detecting coil formed to be wound the A and B cores 3 and 4 on the printed circuit board, the x-axis magnetic core 1 is formed to be a closed magnetic circuit so that induced waveforms in the A and B cores 3 and 4 cancel each other when the external magnetic field Hext is not applied to the A and B cores 3 and 4. In this case, circuit patterns are formed above and below the A and B cores 3 and 4, respectively, and the circuit patterns formed above and below the A core and the circuit patterns formed above and below the B core are symmetrical to each other.

To construct the circuit patterns, blind via holes are used to connect the circuit patterns formed above and below the A and B cores 3 and 4. In this case, lands are used to reduce tolerances of the location accuracy in the case of applying the printed circuit board technology.

The number of the lands is the same as that of the circuit patterns wound around the A and B cores 3 and 4. If the distances between the lands are distant, the distances between the circuit patterns wound around the A and B cores 3 and 4 are distant, so that the sensitivity of the sensor becomes low.

Accordingly, the present invention is to provide a sensor having high sensitivity sensor by arranging a greatest number of the lands in a constant area. However, the exciting coils and the detecting coil are formed to be solenoidal, and the circuit patterns formed above and below the A core and the circuit patterns formed above and below the B core are symmetrical to each other.

Lands shown in FIG. 1 are arranged in twelve zigzag lines, which are divided into four upper lines, four middle lines and four lower lines. Lands positioned at two upper lines in the four upper lines are used to connect upper and lower exciting circuit patterns, and lands positioned at the remaining two lines of the upper four lines are used to connect upper and lower detecting circuit patterns. In this case, use of lands positioned in the four lower lines is symmetrical to that of the lands positioned in the four upper lines. That is, lands positioned at the two lower lines in the four lower lines are used to connect upper and lower exciting circuit patterns, and lands positioned at the remaining two lines of the four lower lines are used to connect upper and lower detecting circuit patterns. Additionally, lands positioned at the four middle lines are used to connect upper and lower exciting circuit patterns. That is, lands positioned at the two upper lines in the four middle lines are used to connect upper and lower exciting circuit patterns disposed around an upper core, and lands positioned around the remaining two lines are used to connect upper and lower exciting circuit patterns disposed around a lower core.

Referring to FIGS. 4b and 4c, a method of winding exciting coils is described as below. In this case, the B core 4 positioned at the lower left side is described for the ease of description with reference to FIGS. 4b and 4c.

As shown in FIGS. 4b and 4c, exciting circuit patterns start to be formed from a first lower exciting circuit land L1 down in the state that lands are arranged.

The first lower exciting circuit land L1 is connected to a second lower exciting circuit land L2 by an exciting circuit pattern, the second lower exciting circuit land L2 is connected to a third upper exciting circuit land L3, and the third upper exciting circuit land L3 is connected to a fourth upper exciting circuit land L4 by an exciting circuit pattern. The fourth upper exciting circuit land L4 is connected to a fifth lower exciting circuit land L5 by a blind via hole, and the fifth lower exciting circuit land L5 is connected to a sixth lower exciting circuit land L6 by an exciting circuit pattern, the sixth lower exciting circuit land L6 is connected to a seventh upper exciting circuit land L7, and the seventh upper exciting circuit land L7 is connected to a eighth upper exciting circuit land L8 by an exciting circuit pattern. Accordingly, 2 turns of the exciting coil are wound around the B core 4. In this case, an exciting coil is wound around a core facing the described core in the similar manner so that a magnetic flux is generated in the reverse direction.

Meanwhile, the detecting coil is wound around the x-axis magnetic core 1 as below. First, a first upper detecting circuit land R1 is connected to a second lower detecting circuit land R2 by a blind via hole by way of a detecting circuit pattern from a start point 39 of the detecting coil, the second lower detecting circuit land R2 is connected to a third lower detecting circuit land R3 by way of a detecting circuit pattern, and the third lower detecting circuit land R3 is connected to a fourth upper detecting circuit land R4 by a blind via hole. Thereafter, a fourth upper detecting circuit land R4 is connected to a fifth upper detecting circuit land R5 by a detecting circuit pattern, the fifth upper detecting circuit land R5 is connected to a sixth lower detecting circuit land R6 by a blind via hole, the sixth lower detecting circuit land R6 is connected to a seventh lower detecting circuit land R7 by way of a detecting circuit pattern. By the method described above, the detecting coil is wound to an end point 40 around the A and B cores 3 and 4. In this case, the location of the upper detecting or exciting circuit lands may be changed to the location of the lower detecting or exciting circuit lands, and the location of the upper detecting or exciting circuit patterns may be changed to the location of the lower detecting or exciting circuit patterns.

In this case, in order to reduce the size of the printed circuit board and allow circuit patterns wound around each of the A and B cores 3 and 4 to be symmetrical to each other in zigzag patterns, the number of lines where the lands are arranged is preferably two, even though the number may be three or more. If the number of the lines is more than three lines, the length of the printed circuit board becomes long, and it is difficult to wind the circuit patterns around each of the A and B cores 3 and 4 in zigzag patterns to be symmetrical to each other while the circuit patterns pass between lands.

Figure 5A:
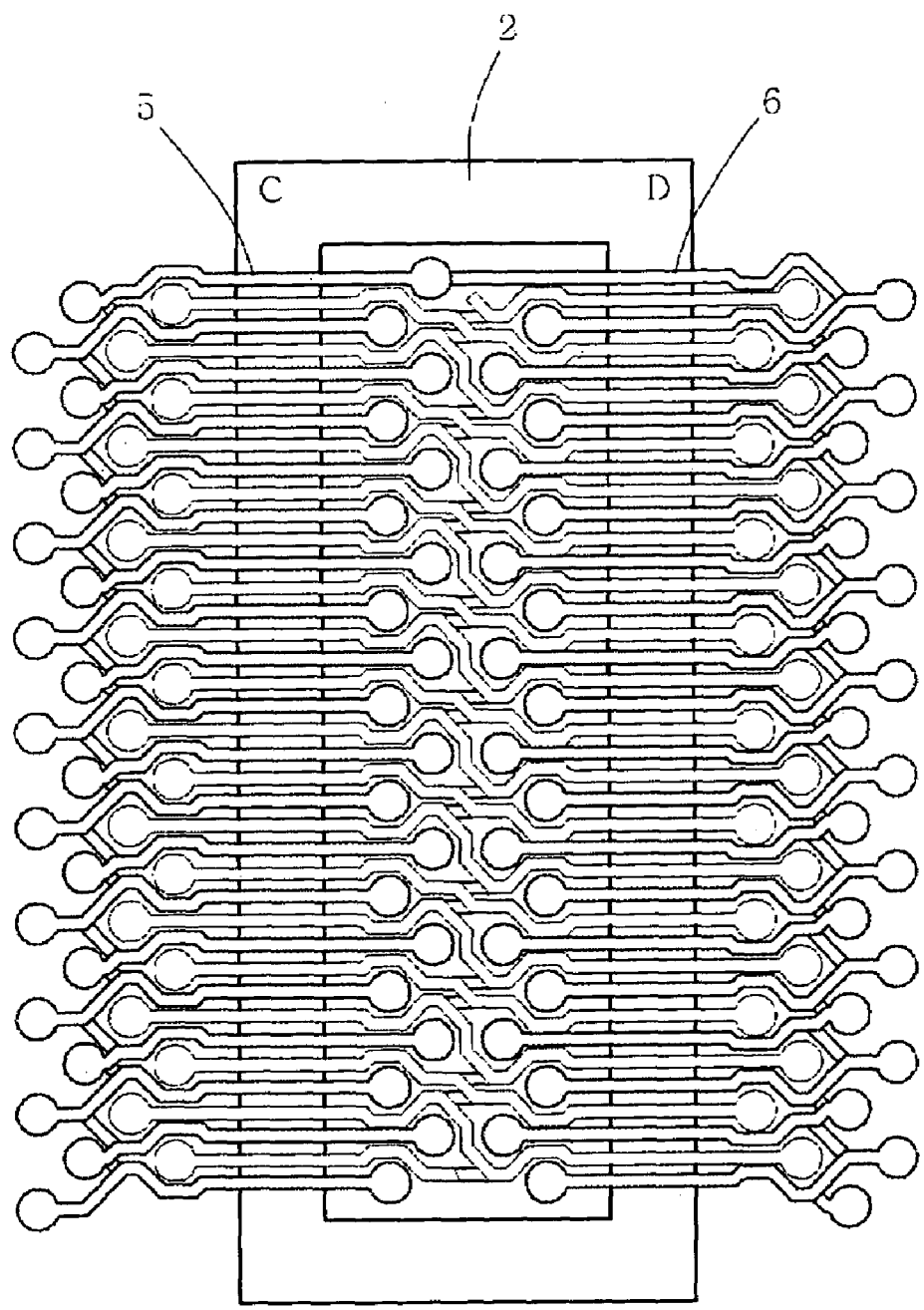
FIGS. 5a to 5c are schematic views of exciting circuit patterns and detecting circuit patterns formed in the y-axis magnetic core of the weak-magnetic field sensor using the printed circuit board technology in accordance with the present invention, which shows a schematic views of the upper and lower circuit patterns, the upper circuit patterns and the lower circuit pattern of the y-axis magnetic core, respectively.
Figure 5B:
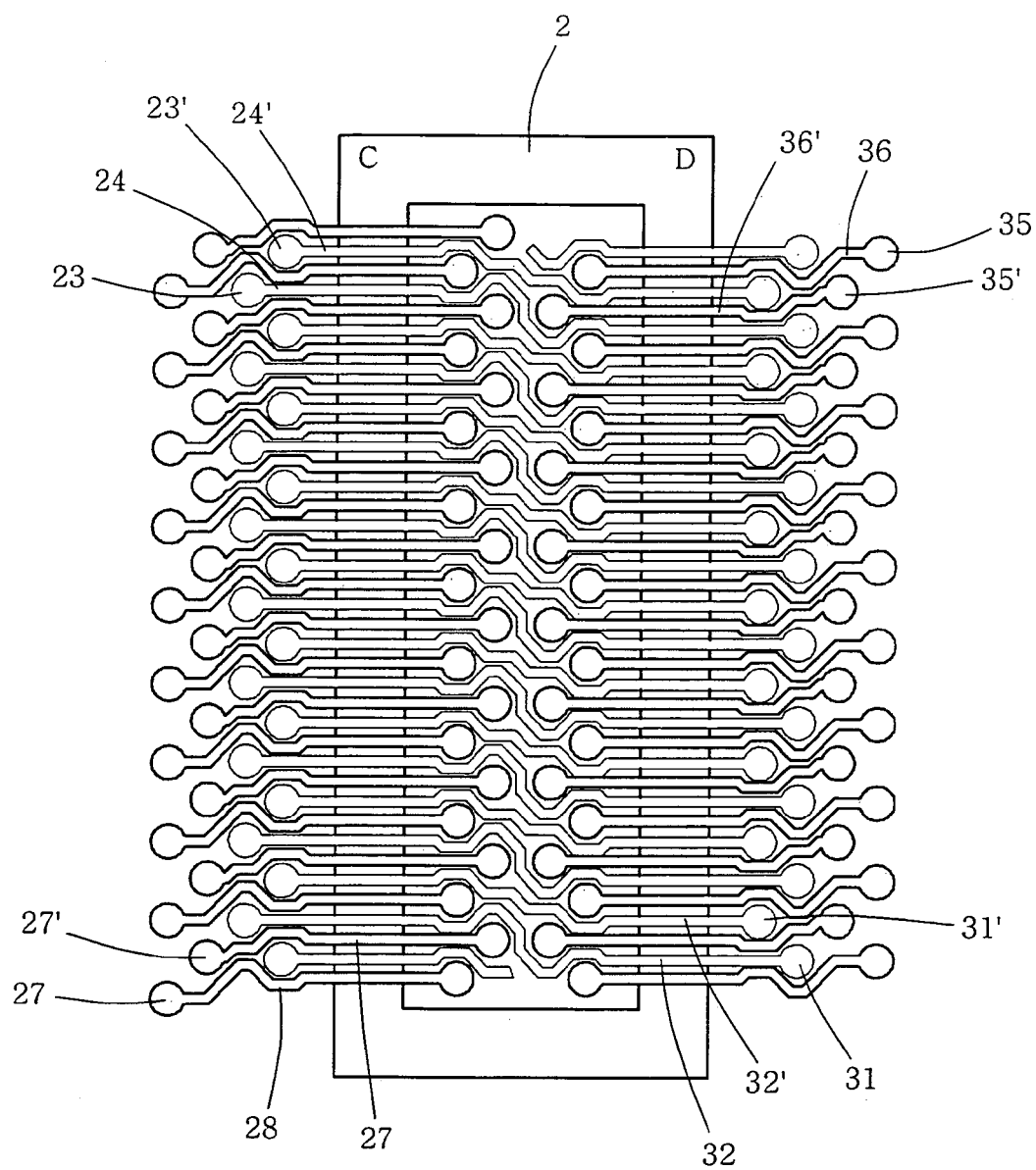
Figure 5C:
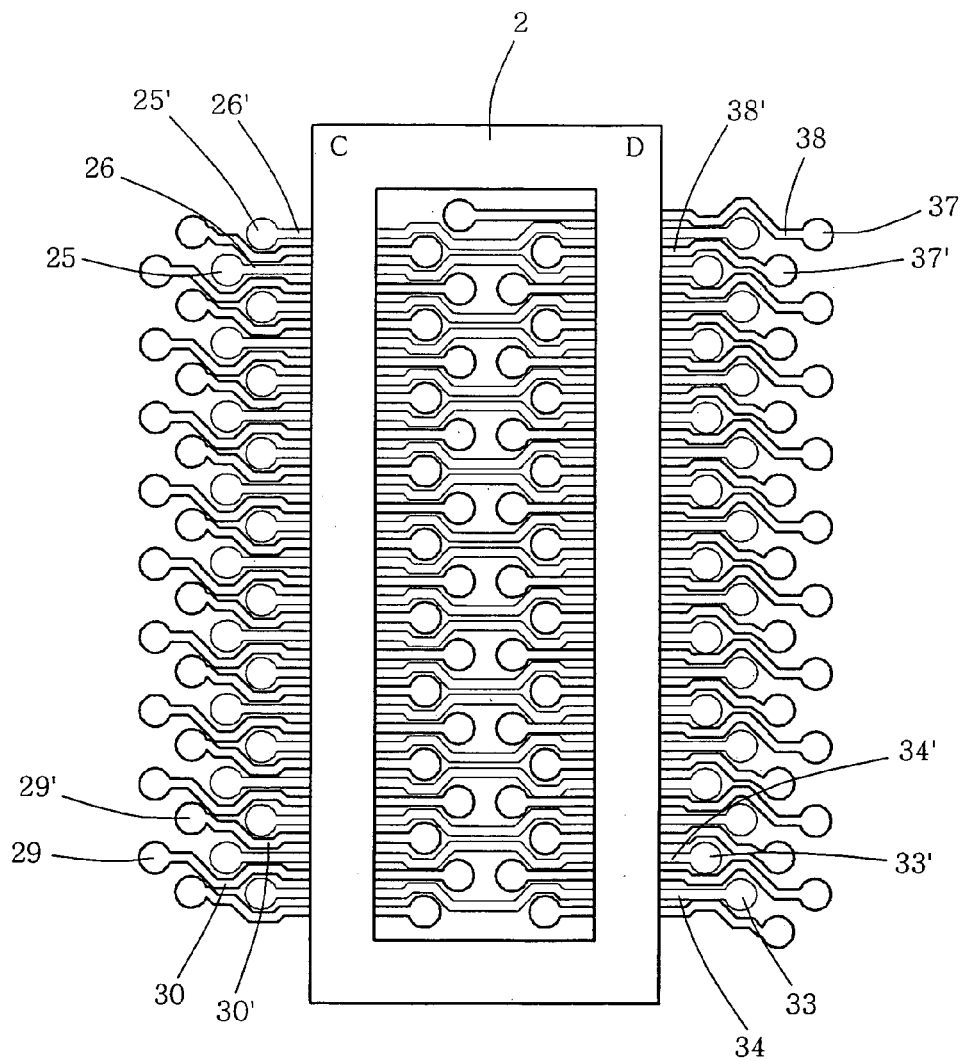

FIGS. 5a to 5c are schematic views of exciting circuit patterns and detecting circuit patterns formed in the y-axis magnetic core of the weak-magnetic field sensor using the printed circuit board technology in accordance with the present invention. FIG. 5a shows a schematic view of the upper and lower circuit patterns of the y-axis magnetic core. FIG. 5b shows a schematic view of the upper circuit patterns of the y-axis magnetic core. FIG. 5c shows a schematic view of the lower circuit patterns of the y-axis magnetic core. That is, FIGS. 5a to 5c have the similar structures, which are rotated counter-clockwise 90° compared to those of the FIGS. 4a to 4c.

Additionally, the detecting coil for detecting the variation of magnetic fluxes is wound to obtain the sum of the variation of the magnetic fluxes generated in the cores by connecting upper and lower detecting circuit patterns, formed above and below each of the two magnetic cores, using blind via holes. The method of arranging the exciting coils shown in FIGS. 5a to 5c and the detecting coil is similar to that of arranging the exciting coils and the detecting coil shown in FIGS. 4a to 4c, except that they are arranged to be perpendicular to the exciting and detecting coils shown in FIGS. 4a to 4c. The reason why the weak-magnetic field sensor is arranged in the horizontal and vertical directions is to detect a weak-magnetic field using a precise azimuth.

Accordingly, the x-axis and y-axis magnetic cores are formed on one printed circuit board, and the exciting coils and the detecting coil-are formed around each of the magnetic cores.

The weak-magnetic field sensor includes one component including a rectangular ring-shaped magnetic core formed in the same surface to minimize magnetic field components leaking from the magnetic core, exciting coils formed to be separated from one another so that detecting circuit patterns disposed above and below the magnetic core, respectively, correspond to each other, and a detecting coil formed between the exciting coils is formed above or below another component having the same construction as that of the one component to be rotated by 90°, so that the sensor can have high sensitivity.

Meanwhile, FIGS. 7a to 7f are timing diagrams showing operations in an x-axis or a y-axis direction in the weak-magnetic field sensor using the printed circuit board technology in accordance with the present invention.

Figure 7:
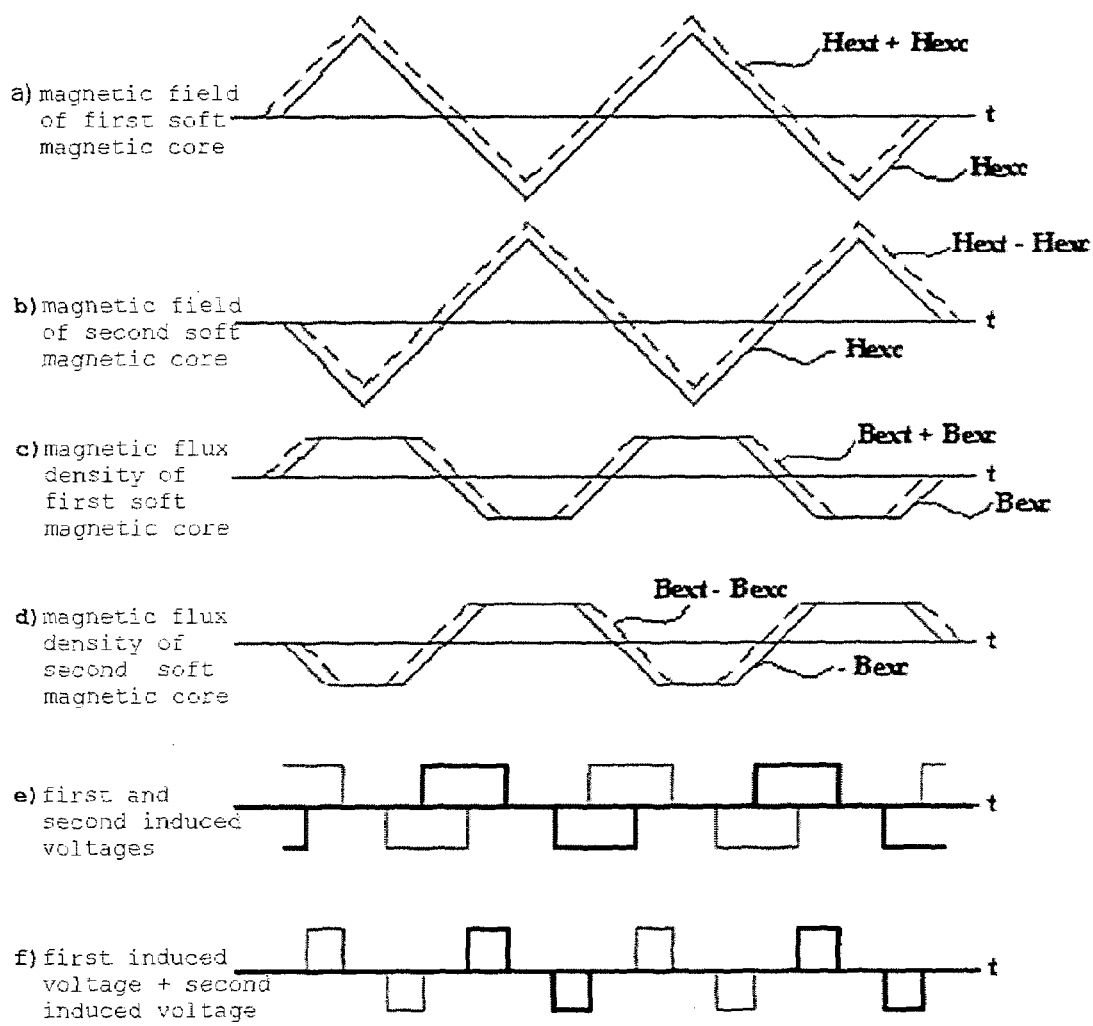
FIGS. 7a to 7f are timing diagrams showing operations in an x-axis or a y-axis direction in the weak-magnetic field sensor using the printed circuit board technology in accordance with the present invention.

FIG. 7a shows the waveform of the magnetic field in a first magnetic core. FIG. 7b shows the waveform of the magnetic field in a second magnetic core. FIG. 7c shows the waveform of the magnetic flux density in the first magnetic core. FIG. 7d shows the waveform of the magnetic flux density in the second magnetic core. FIG. 7e shows first and second induced voltages induced in a detecting coil. FIG. 7f shows the sum of the first and second induced voltages induced from the detecting coil. In this case, the first and second magnetic cores can be A and B cores, or C and D cores, respectively.

Referring to FIGS. 7a to 7f, a structure in which the detecting coil and the exciting coils formed around each of the rectangular ring-shaped A and B cores is formed on the printed circuit board.

In this case, the first and second induced voltages induced in the detecting coil for detecting the variation of magnetic fluxes caused by electromagnetic induction resulting from the application of the alternating excitation current cancel each other, since the magnetic fluxes generated in the two A and cores 3 and 4 have reverse directions. The induced voltages are voltages that are generated by being induced and generated from the exciting coils according to the variation of the magnetic fluxes.

However, since the external magnetic field Hext is applied to the A and B cores 3 and 4 in the same direction when the external magnetic field Hext is applied in the axis direction of the two A and B cores 3 and 4, the magnetic fields in the two A and cores 3 and 4 are Hext+Hexc and Hext−Hexc, respectively, if the exciting magnetic field is referred to as the Hexc. In this case, FIGS. 7c and 7d show the magnetic flux densities in these magnetic fields.

In this case, as shown in FIG. 7e, voltages are induced in the detecting coil. The size of the external magnetic field Hext can be found by measuring the size of the voltages by a signal process circuit.

Figure 8:
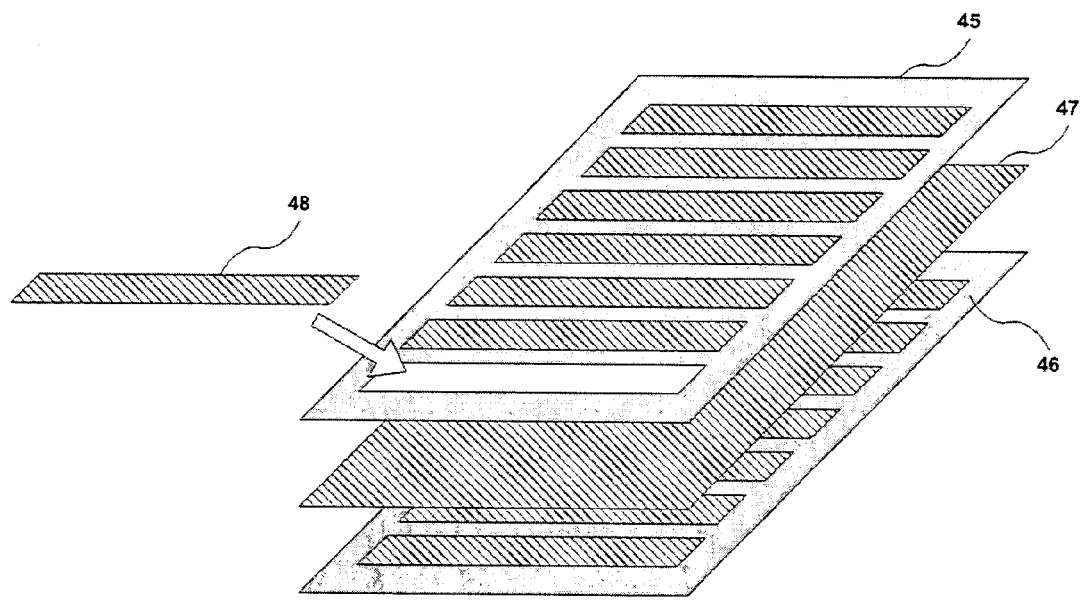
FIG. 8 shows an example of a first laying-up structure of the weak-magnetic field sensor using the printed circuit board technology in accordance with the present invention.

Meanwhile, FIG. 8 shows an example of a first laying-up structure of the weak-magnetic field sensor using the printed circuit board technology in accordance with the present invention, which shows an example of the laying-up process in a process manufacturing a workpiece in the form of a printed circuit board in consideration of the size of the workpiece. A finished product in an actual manufacturing process is generally formed in a strip form including a plurality of printed circuit board units for sensing a weak-magnetic field.

Referring to FIG. 8, the laying-up process of seven magnetic ribbons 48 is shown, in which each of the magnetic ribbons used to be manufactured in a strip form including a plurality of units. Accordingly, the size of the magnetic ribbons 48 is determined by considering the size of the strip. In this case, reference numerals 45, 46 and 47 designate an upper copper foil, a lower copper foil and a layer formed of a prepreg, a first inner layer and a prepreg, respectively.

However, in the case of forming a printed circuit board in a strip form as described above, magnetic ribbons must be arranged at desirable positions of the prepregs in the process of patterning the magnetic ribbons so that a plurality of units are manufactured. Accordingly, in the example shown in FIG. 8, a laying-up process is performed by arranging copper foils 45 and 46 manufactured as a kind of frames for arranging the magnetic ribbons on uppermost portions.

There are two methods to manufacture the copper foils 45 and 46. That is, one is a method of partially removing desired portions by pressing copper foils 45 and 46 using a mold. The other is a method of partially removing desired portions through a rotating processing material using a routing process of the general methods of manufacturing substrates.

In this case, the sizes of the manufactured copper foils 45 and 46 should be larger than those of the magnetic ribbons 48. It is preferable that copper foils are manufactured to have margins of about 0.1~0.2 mm with respect to any one axis of the magnetic ribbons, with taking into consideration machining tolerance and the problem that the magnetic ribbons 48 are covered with the copper foils 45 and 46.

Additionally, when an area that an actual product occupies in a strip is considered, the width of the magnetic ribbon 48 has a certain amount of margin, so that the width of the magnetic ribbon 48 can be used to correspond to the width of the strip. However, the length of the magnetic ribbon 48 is determined at the time of initially designing the printed circuit board because one or more magnetic ribbons are disposed in the strip.

Figure 9:
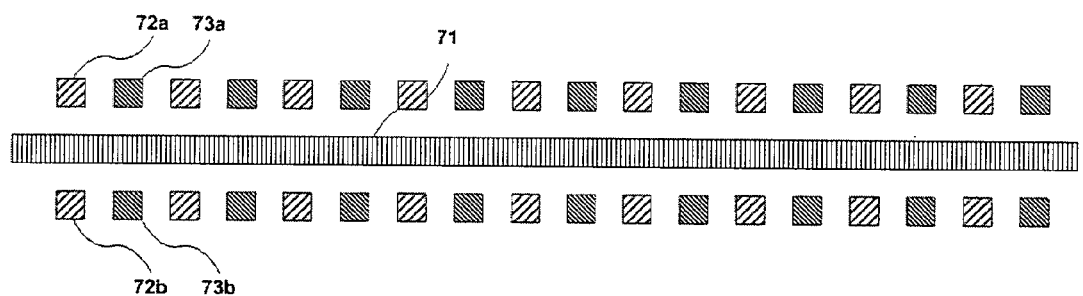
FIG. 9 is a sectional view of circuit patterns formed above and below an x-axis magnetic core in a weak-magnetic field sensor using the printed circuit board technology in accordance with the present invention.

FIG. 9 is a sectional view of circuit patterns formed above and below an x-axis magnetic core in a weak-magnetic field sensor using the printed circuit board technology in accordance with the present invention.

In FIG. 9, there is shown the sectional view of the magnetic core for sensing a magnetic field in the x-axis direction and the circuit patterns positioned above and below the magnetic core, respectively, so that exciting coils and a detecting coil are formed. In this case, a reference numeral 71 designates the magnetic core. Reference numerals 72a and 72b each designate the exciting circuit pattern. Reference numerals 73a and 73b each designate the detecting circuit pattern. If the exciting coil patterns 72a arranged above the magnetic core 71 are positioned to correspond to the exciting circuit patterns 72b arranged below the magnetic core 71, the exciting circuit patterns 72b arranged below the magnetic core 71 are not seen when observed from the top.

The detecting circuit patterns 73a and 73b are arranged between the exciting circuit patterns 72a and 72b. In this case, the detecting circuit patterns 73a arranged above the magnetic core 71 are positioned to correspond to the detecting circuit patterns 73b arranged below the magnetic core 71.

Additionally, differently from the above described construction, a magnetic field can be detected in the case where an exciting coil and a detecting coil are wound around a bar core, but the waveform of an induced voltage induced by the large exciting coil is generated in the detecting coil without applying an external magnetic field. Accordingly, signal processing for amplifying and filtering the output of the detecting coil is complicated. Accordingly, it is desirable to use one rectangular ring-shaped magnetic core in the signal processing.

Hereinafter, there is described a method of manufacturing a weak-magnetic field sensor using the printed circuit technology with reference to FIGS. 6a to 6m. FIGS. 6a to 6m are sectional views taken along lines E–E' of FIG. 1, which show sectional views showing the manufacturing process of the weak-magnetic field sensor using the printed circuit board technology.

Figure 6A:
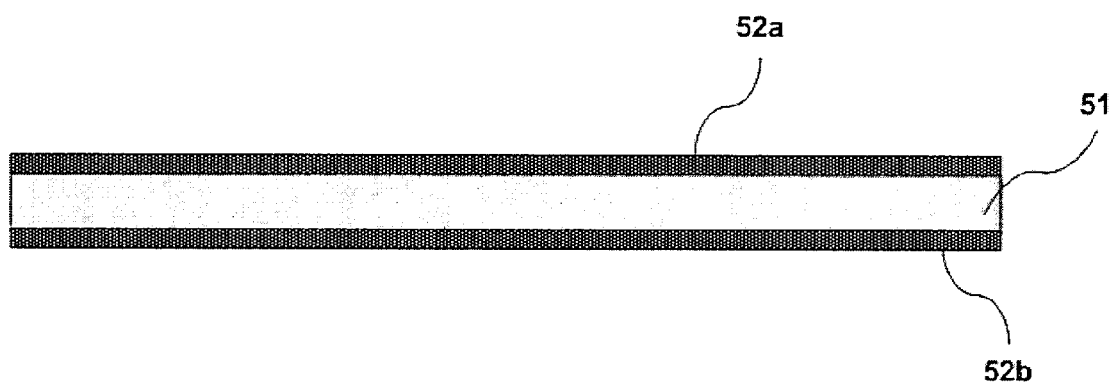
FIGS. 6a to 6m are views showing a process of manufacturing the weak-magnetic field sensor using the printed circuit board technology in accordance with the present invention.
Figure 6B:
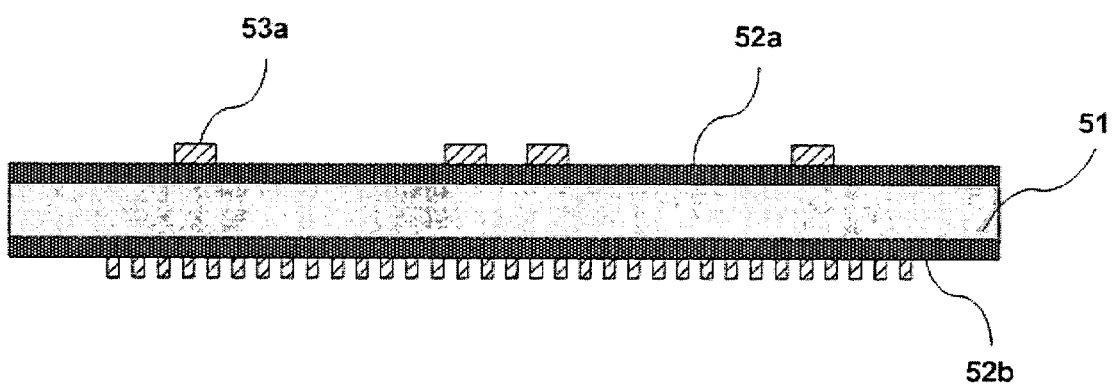
Figure 6C:
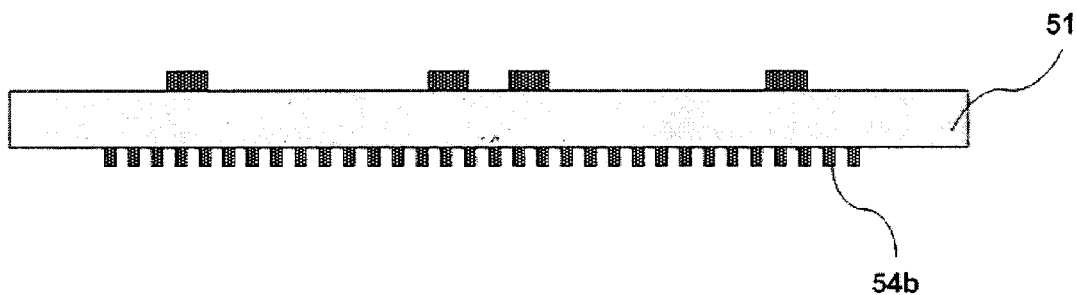
Figure 6D:
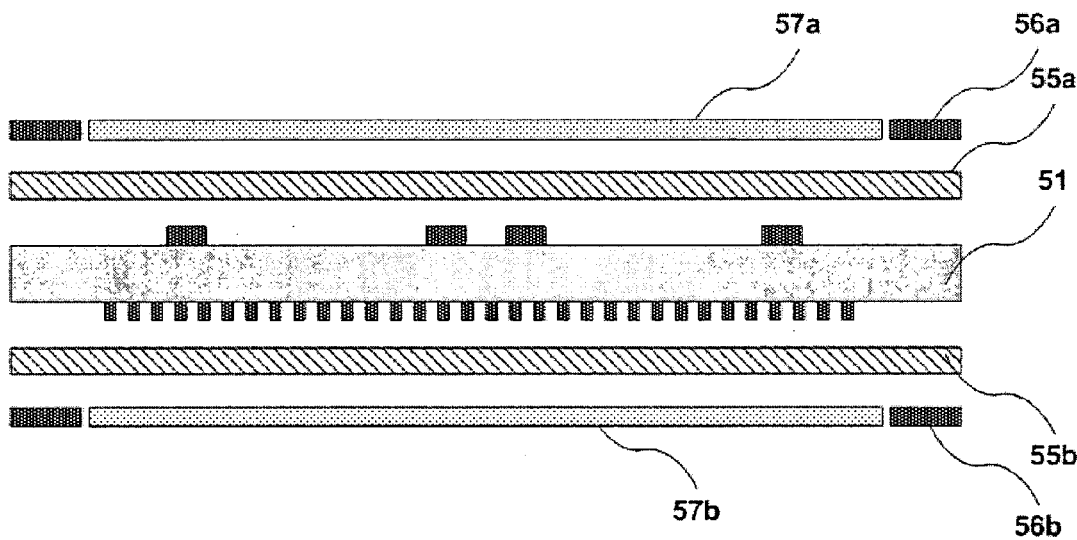

First, FIGS. 6a to 6c show the steps of manufacturing the first inner layer of the weak-magnetic field sensor. That is, a copper clad laminate 51 having copper foils 52a and 52b on both sides thereof, respectively, is formed (see FIG. 6a) Thereafter, photosensitive coating layers 53a and 53b are formed on the copper foils 52a and 52b, respectively, are exposed to light, and are developed (see FIG. 6b). Thereafter, exciting and detecting circuit patterns 54b disposed below an x-axis magnetic core are formed, exciting and detecting circuit patterns 54a disposed above a y-axis magnetic core are formed, and surface treatment is carried out to form the magnetic cores (see FIG. 6c). Accordingly, the first inner layer is formed as described above.

FIGS. 6d to 6g show the steps of manufacturing the second inner layer of the weak-magnetic field sensor. As described above, B-stage thermosetting resins (hereinafter referred to as "prepregs") 55a and 55b are disposed below and above the first inner layer, respectively, and magnetic ribbons 57a and 57b for forming the magnetic cores are disposed at precise locations below the prepreg 55a and above the prepreg 55b, respectively. In this case, in order to find the precise locations, copper foils 56a and 56b are formed to be larger than the magnetic ribbons 57a and 57b, which is referred to as a laying-up process (see FIG. 6d).

In this case, the prepregs 55a and 55b are thermosetting epoxy resins, which are known in the manufacturing industry of printed circuit boards. Additionally, the copper foils 56a and 56b may be formed to be 12 μm, 18 μm or 35 μm thick, but they are formed to be 18 μm thick, similar to those of the magnetic ribbons 57a and 57b in the present invention. In this case, the thickness of the prepregs 55a and 55b is 0.03 mm~0.1 mm thick.

Figure 6E:
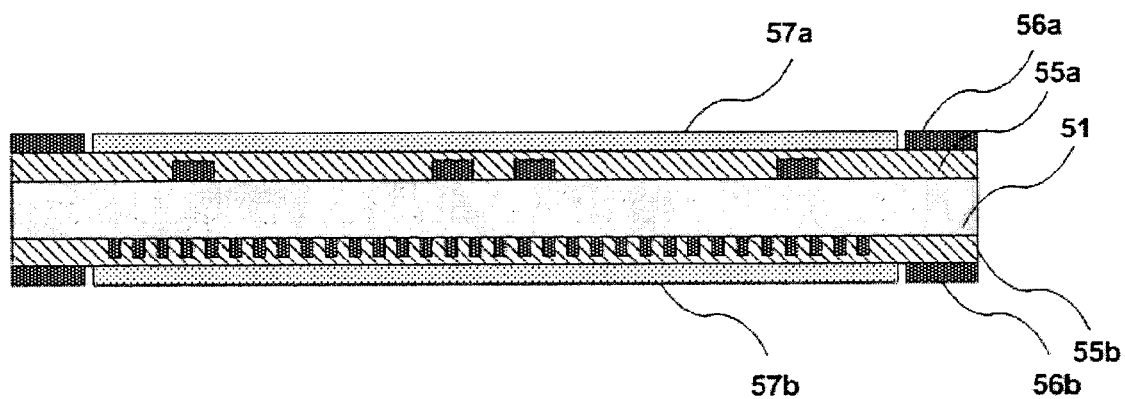

Thereafter, the magnetic ribbons 57a and 57b are attached to both sides of the first inner layer along with the prepregs 55a and 55b under high temperature and high pressure so that the magnetic ribbons 57a and 57b are in contact with the both sides of the first inner layer, respectively (see FIG. 6e).

Figure 6F:
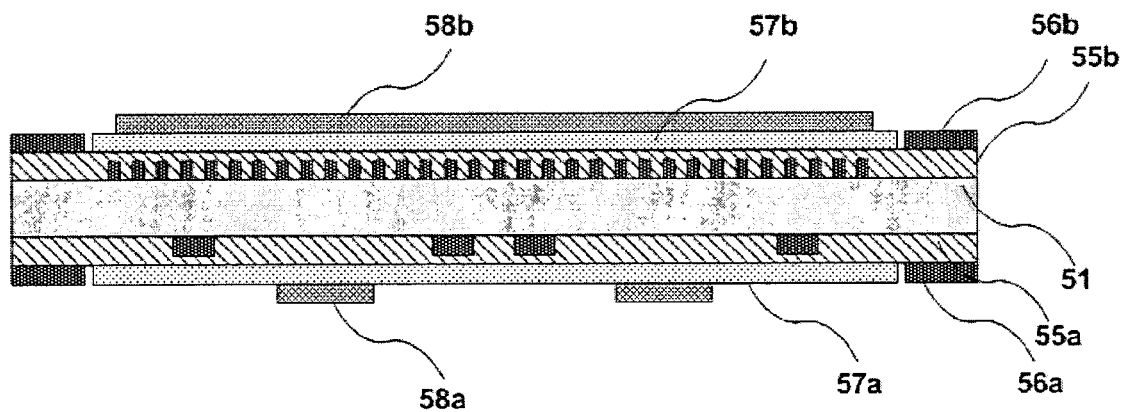
Figure 6G:
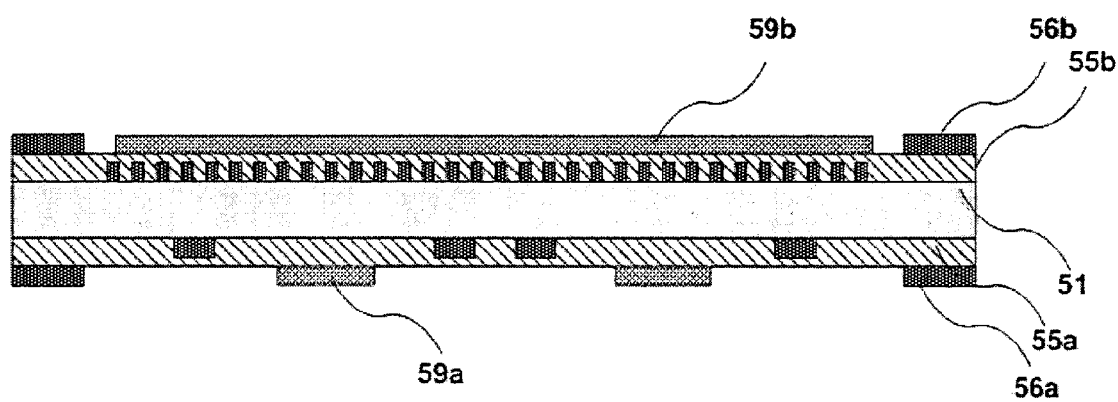
Figure 6H:
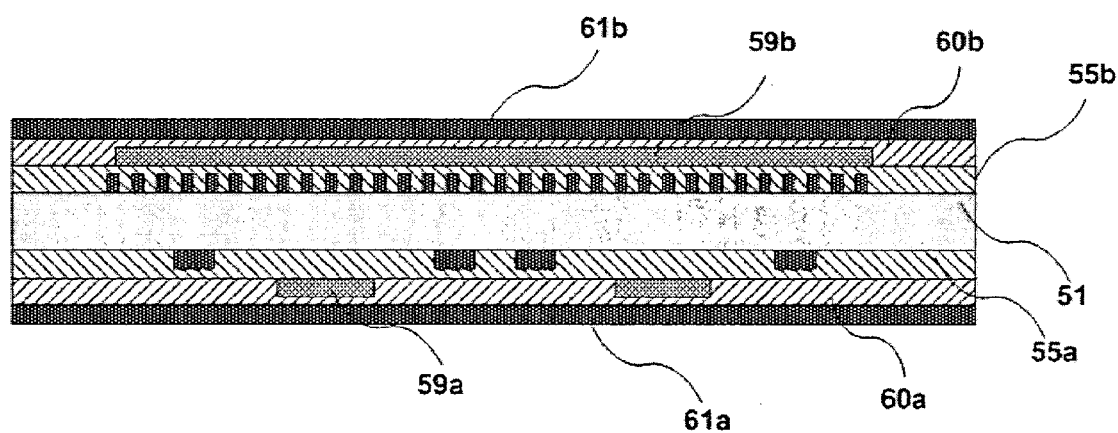

Thereafter, photosensitive coating layers 58a and 58b are formed on the magnetic ribbons 57a and 57b, respectively, are exposed to light, and are developed (see FIG. 6f). The magnetic ribbons 57a and 57b are etched, so that the magnetic cores 59a and 59b are formed, and surface treatment is carried out (see FIG. 6g). The surface treatment refers to an abrasion process to stack one on top of another.

Accordingly, the second inner layer is formed as described above.

FIGS. 6h to 6m show the steps of manufacturing the outer layer of the weak-magnetic field sensor. First, prepregs 60a and 60b are formed on the second inner layer under high temperature and high pressure, respectively, and second copper foils 61a and 61b are formed above and below the prepregs 60a and 60b under high temperature and high pressure, respectively, in order to form upper and lower circuit patterns of the magnetic cores 59a and 59b, respectively. In this case, the prepregs 60a and 60b are formed to be the same thickness as the prepregs 55a and 55b of the first inner layer, and the second copper foils 61a and 61b are formed to be thinner than the copper foils of the first inner layer. The copper foils 61a and 61b having a thickness of 12 μm are used in the present invention. Accordingly, the outer layer is formed as described above (see FIG. 6h).

Figure 6I:
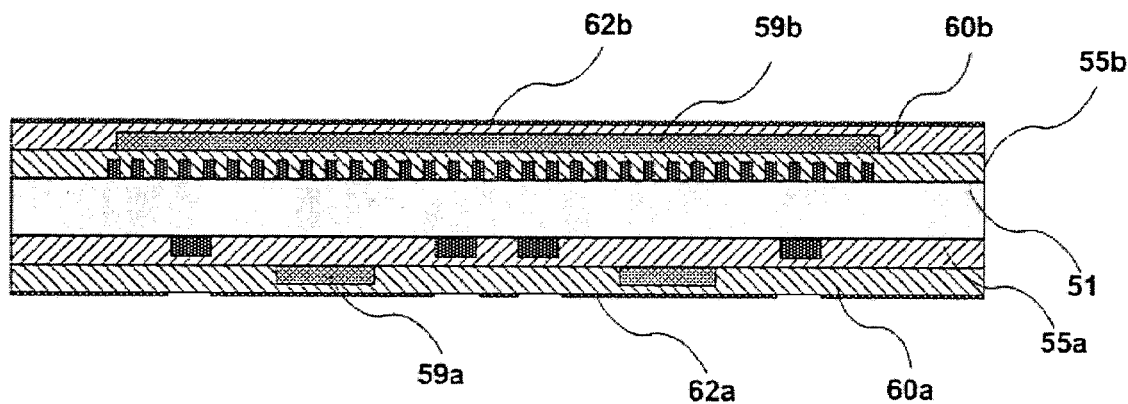

Thereafter, after the outer layer is formed, the 12 μm thick copper foils 61a and 61b are made to be 3~5 μm thick copper foils 62a and 62b by uniformly etching the second copper foils 61a and 61b, in consideration of metal coating to be carried out later (see FIG. 6i). Thereafter, some portions of the copper foil 62a are removed using a laser drill and then blind via holes 63 are formed so that the upper and lower exciting circuit patterns of each of the x-axis and y-axis magnetic cores 59a and 59b are connected to each other to be solenoidal and the upper and lower detecting circuit patterns of each of the x-axis and y-axis magnetic cores 59a and 59b are connected to each other to be solenoidal.

Figure 6J:
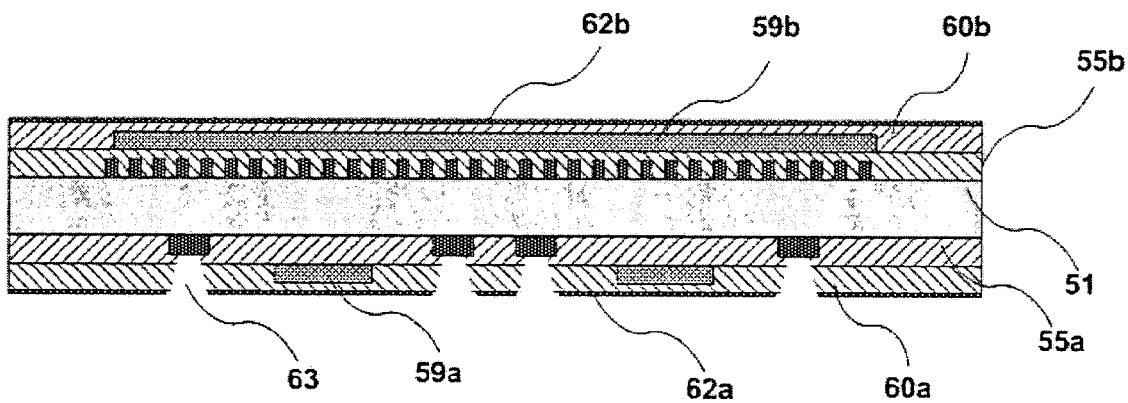

Thereafter, the portions, where the copper foils 62a are removed, are etched using a laser drill for removing only epoxy so that the circuit patterns of the first inner layer are exposed, and then surface treatment is carried out for metal coating (see FIG. 6j).

Figure 6K:
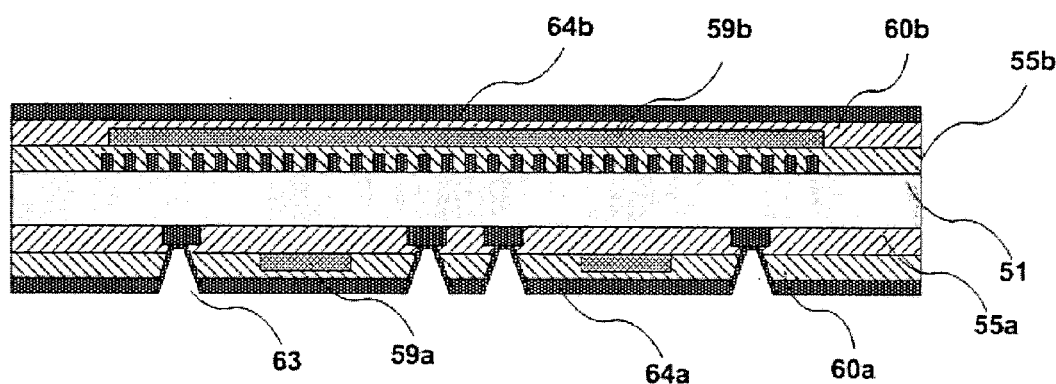

Thereafter, copper plating layers 64a and 64b coated with copper are formed to be 15 and 18 μm thick on the exposed surfaces of the printed circuit board and the blind via holes 63, respectively (see FIG. 6k).

Figure 6L:
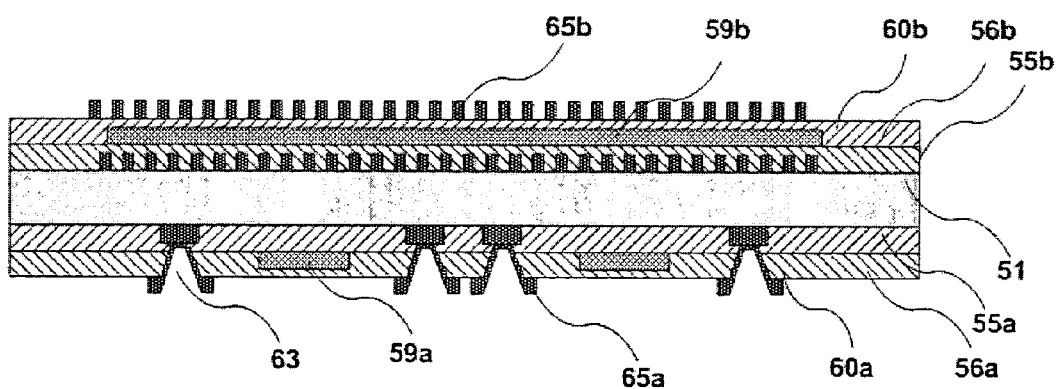
Figure 6M:
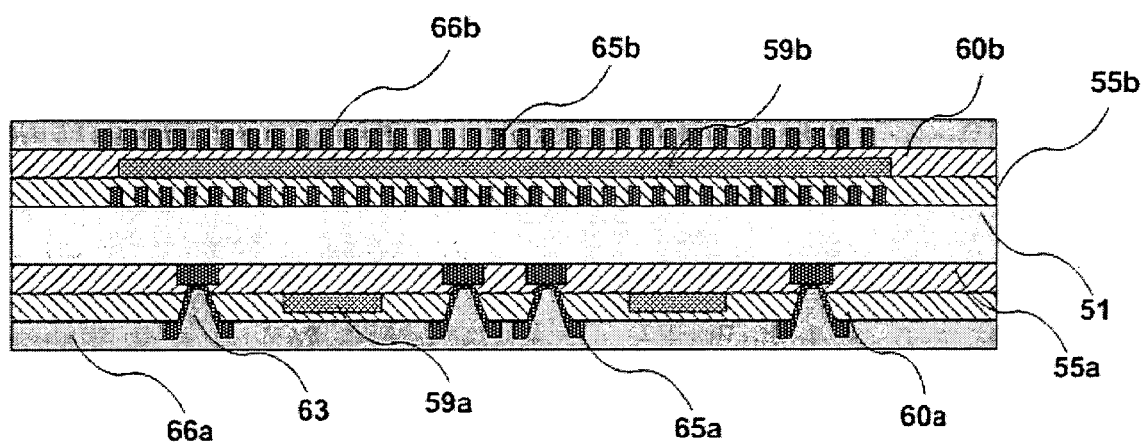

After the copper plating layers 64a and 64b are formed, exciting and detecting circuit patterns 65a and 65b are formed at each of two positions below the magnetic core 59a and above the magnetic core 59b through exposure, development and etching processes using photosensitive films (see FIG. 6l).

Thereafter, after the circuit patterns 65a and 65b are formed, solder resists S/R 66a and 66b are formed and some portions of the solder resist 66a and 66b to be coated with gold are opened through exposure and development processes so that signal process connections are coated with gold. That is, after the solder resists S/R 66a and 66b are formed, exposed portions are coated with gold, so that the manufacture of the weak-magnetic field sensor of the present invention is completed (see FIG. 6m).

Thereafter, an external shape of the weak-magnetic field sensor is processed to form a desired size of the sensor. That is, as shown in FIGS. 6a to 6m, the magnetic cores 59a and 59b are formed to be arranged in another layers and perpendicular to each other, exciting coils and the detecting coil are formed above and below each of the magnetic cores, and pads are formed on the outermost layer to pass electricity.

In the magnetic field sensor of the present invention formed as described above, the shapes of magnetic cores 59a and 59b stacked on the printed circuit board and the shapes of the exciting coils and detecting coils stacked on the printed circuit board are important. A rectangular ring-shaped core having two parallel cores connected to each other and differentially driven is formed to be a closed-magnetic circuit, and has a winding structure by which induced waveforms generated due to the variation of magnetic fluxes generated in the rectangular ring-shaped core by the exciting coils are cancelled if an external magnetic field is not applied to the rectangular ring-shaped core.

Therefore, the weak-magnetic field sensor of the present invention includes rectangular ring-shaped magnetic cores perpendicular to each other, which form the closed-magnetic circuits, respectively, to minimize the magnetic components leaking from each of the rectangular ring-shaped magnetic cores. Additionally, the weak-magnetic field sensor of the present invention includes separated differential exciting coils wound around two parallel cores of the rectangular ring-shaped magnetic core, respectively, to be solenoidal and the detecting coil to obtain the sum of magnetic fluxes generated in the magnetic core to be solenoidal. Accordingly, if an external magnetic field is zero, no waveform is induced in the detecting coil.

Additionally, the weak-field magnetic sensor of the embodiment of the present invention includes separated differential exciting coils that are wound around two portions of each of rectangular ring-shaped magnetic cores perpendicular to each other, respectively, each magnetic core being formed in a direction in which magnetic fluxes are detected to reduce demagnetizing field components, and the detecting coils that are formed between the differential exciting coils to obtain the sum of magnetic fluxes generated in the magnetic core. Accordingly, if an external magnetic field is zero, no waveform is induced in the detecting coil.

Accordingly, although the weak-magnetic field sensor of the present invention is super miniaturized, it has high sensitivity and can detect very weak-magnetic field. For example, the weak-field magnetic sensor of the present invention is used for a navigation system according to terrestrial magnetism detection, a monitor displaying the change of terrestrial magnetism for earthquake prediction, a sensor for measuring body magnetism, and a sensor for detecting defects of metallic materials. Additionally the magnetic sensor is widely used for a magnetic encoder, a non-contact potentiometer, a current sensor, a torque sensor and a displacement sensor.

As described above, the present invention provides a weak-field magnetic sensor using printed circuit board technology, in which a magnetic core formed in a substrate, exciting coils formed of metallic materials for alternating current excitation and a detecting coil formed of a metallic material to detect the variation of magnetic fluxes induced by the exciting coil, thereby precisely detecting a magnetic field due to its high sensitivity. Additionally, the present invention provides a weak-field magnetic sensor using printed circuit board technology, in which a magnetic core, exciting coils and a detecting coil are stacked using a printed circuit board, thereby being capable of being integrated with another sensor or circuits. Accordingly, the sensor can be super miniaturized and very sensitive and be inexpensively mass-produced.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A weak-magnetic field sensor using printed circuit board technology, comprising:
    a first magnetic core having first and second cores connected in parallel to each other;
    a first surface disposed above said first magnetic core;
    a second surface disposed below said first magnetic core;
    first and second exciting coils, each exciting coil including a first set of exciting patterns formed on said first surface, a second set of exciting patterns formed on said second surface and exciting interconnecting members interconnecting said first and second set of exciting patterns, said first and second exciting coils being formed of respective first and second exciting turns wound around the first and second cores with the first exciting turns being wound around only the first core and the second exciting turns being wound only around said second core, respectively, to supply alternating excitation current to the first magnetic core; and
    a first detecting coil alternately arranged between the first exciting coils, said first detecting coil including a first set of detection patterns formed on said first surface, a second set of detection patterns formed on said second surface and detection interconnecting members interconnecting said first and second set of exciting patterns to define detecting turns wound around both the first and second cores, in order to detect variation of magnetic fluxes generated in the first magnetic core;
    wherein the detecting turns are alternating with the first and second exciting turns; and
    wherein the first exciting coils are formed of metallic materials to be solenoidal for alternating current excitation and differential excitation and the first detecting coil is formed of a metallic material to be solenoidal for detecting the variation of the magnetic fluxes generated in the first magnetic core;
    wherein the first magnetic core is formed in a direction in which the magnetic fluxes are detected to reduce demagnetizing field components.

2. The weak-magnetic field sensor according to claim 1, wherein the first magnetic core is a rectangular ring-shaped core.

3. The weak-magnetic field sensor according to claim 1, wherein the magnetic core, the exciting coil and the detecting coil are formed on a printed circuit board, and the printed circuit board includes a Copper Clad Laminate (CCL) and a prepreg, and the prepreg is formed of one of FR-4 epoxy, BT resin, Teflon and polyimide.

4. The weak-magnetic field sensor according to claim 1, wherein upper and lower portions of each of the exciting coil patterns and the detecting coil pattern are connected by blind via holes coated with copper.

5. The weak-magnetic field sensor according to claim 1, wherein lands of each of the exciting coil patterns and lands of the detecting coil pattern are arranged to form two lines.

6. The weak-magnetic field sensor according to claim 1, wherein the exciting coils are wound from lower portions of the first and second cores, respectively, and they are symmetrical to each other.

7. The weak-magnetic field sensor according to claim 1, further comprises:
- a second magnetic core having third and fourth cores connected in parallel to each other, said third and fourth cores being perpendicular to said first and second cores;
- third and fourth exciting coils wound only around the third and fourth cores, respectively, to supply alternating excitation current to the second magnetic core; and
- a second detecting coil alternately arranged between the the third and fourth exciting coils on the same surfaces on which the third and fourth exciting coils are formed, and including a second set of detection patterns wound around both the third and fourth cores, in order to detect variation of magnetic fluxes generated in the second magnetic core.

* * * * *